United States Patent
Ba et al.

(10) Patent No.: US 10,707,881 B1
(45) Date of Patent: Jul. 7, 2020

(54) ADAPTIVE NOISE CANCELLATION

(71) Applicant: GLOBALFOUNDRIES INC., Grand Cayman (KY)

(72) Inventors: Seydou Ba, Cedar Park, TX (US); Ahmed R. Fridi, Richardson, TX (US)

(*) Notice: Subject to any disclaimer, the term of this patent is extended or adjusted under 35 U.S.C. 154(b) by 0 days.

(21) Appl. No.: 16/440,179

(22) Filed: Jun. 13, 2019

(51) Int. Cl.
| H03L 7/00 | (2006.01) |
| H03L 7/08 | (2006.01) |
| H03H 11/16 | (2006.01) |
| H03K 5/13 | (2014.01) |
| H03L 7/093 | (2006.01) |
| H03L 7/099 | (2006.01) |
| H03L 7/197 | (2006.01) |

(52) U.S. Cl.
CPC ............ *H03L 7/093* (2013.01); *H03L 7/0991* (2013.01); *H03L 7/197* (2013.01)

(58) Field of Classification Search
CPC ........ H03L 7/093; H03L 7/0991; H03L 7/197
See application file for complete search history.

(56) References Cited

U.S. PATENT DOCUMENTS

| | | | | |
|---|---|---|---|---|
| 6,670,854 B2 * | 12/2003 | Takeda | ................. | H03L 7/0891 327/117 |
| 7,068,110 B2 * | 6/2006 | Frey | ..................... | H03L 7/0891 327/147 |
| 7,880,516 B2 | 2/2011 | Beaulaton et al. | | |
| 7,907,016 B2 * | 3/2011 | Eikenbroek | .......... | H03L 7/1976 327/156 |
| 7,961,833 B2 * | 6/2011 | Albasini | ............... | H03L 7/0891 375/376 |
| 7,999,622 B2 * | 8/2011 | Galton | .................. | H03K 23/54 331/1 A |
| 8,193,845 B2 * | 6/2012 | Jian | ....................... | H03L 7/1976 327/147 |
| 8,604,840 B2 * | 12/2013 | Ahmadi | ............... | H03L 7/1976 327/107 |
| 8,686,771 B2 * | 4/2014 | Frantzeskakis | ........... | H03L 7/10 327/150 |
| 9,236,873 B1 | 1/2016 | Buell | | |
| 9,319,051 B2 | 4/2016 | Syllaios et al. | | |

OTHER PUBLICATIONS

Ahmed R. Fridi et al.,"A Low Power Fully-Integrated 76-81 GHz ADPLL for Automotive Radar Applications with 150 MHz/us FMCW Chip Rate and -95dBc/Hz Phase Noise at 1 MHz Offset in FDSOI", Mantric Technology, Toronto Ontario, Canada, 4 pages, Jun. 2, 2019.

* cited by examiner

*Primary Examiner* — Kenneth B Wells
(74) *Attorney, Agent, or Firm* — David Cain; Andrew M. Calderon; Roberts Calderon Safran & Cole, P.C.

(57) ABSTRACT

The present disclosure relates to a structure including an adaptive noise canceller circuit which is configured to suppress noise in a feedback sigma-delta modulator circuit and provide real-time tracking of a noise cancellation signal.

15 Claims, 5 Drawing Sheets

ADAPTIVE NOISE CANCELLATION

FIELD OF THE INVENTION

The present disclosure relates to an adaptive noise cancellation circuit, and more particularly, to a circuit and a method for adaptive noise cancellation for fractional-N digital phase-locked loops (DPLL).

BACKGROUND

A phase locked loop (PLL) is an essential component of radio frequency (RF) and millimeter wave (mmWave) applications. A high performance PLL is needed to implement the RF and mmWave applications.

In known fractional-N frequency synthesizers for the PLL, an effective frequency divide ratio is a fractional number, which enables a relatively high frequency reference signal to be used to achieve fine resolution of frequencies in synthesizer output signals. This fractional number is typically achieved by periodically changing an integer divide ratio so that a desired fractional number can be approximated.

One typical disadvantage associated with fractional-N frequency synthesis is the generation of unwanted low-frequency "spurs" by a divider. These spurs make fractional-N frequency synthesizers impractical for many applications unless they are suppressed to a negligible level. Further, in fractional-N frequency synthesizers, a sigma-delta modulator is used to generate an average fractional value. However, the sigma-delta modulator also generates unwanted noise.

One challenge of noise cancellation in fractional N-frequency synthesizers is being able to accurately determine an error gain. The error gain is a ratio of the time to digital converter (TDC) gain (i.e., $2*K_{TDC}$) to a channel number (i.e., N+Frac). One possible approach to noise cancellation is to measure the TDC gain by measuring a known pulse and then using a sequential divider to compute the ratio. In another possible approach to noise cancellation, a correlator and a low pass filter are used to accurately determine the error gain. However, these approaches for noise cancellation use analog circuitry, are non-adaptive, and/or requires complex circuitry.

SUMMARY

In an aspect of the disclosure, a structure includes an adaptive noise canceller circuit which is configured to suppress noise in a feedback sigma-delta modulator circuit and provide real-time tracking of a noise cancellation signal.

In another aspect of the disclosure, a circuit includes a feedback sigma-delta modulator circuit which is configured to calculate a fractional value that includes noise in a digital phase locked loop (DPLL) circuit, and an adaptive noise canceller circuit which includes a priority encoder approximation circuit and is configured to generate a noise cancellation signal to suppress the noise in the DPLL circuit.

In another aspect of the disclosure, a method includes generating a noise cancellation signal to suppress noise in a digital phase locked loop (DPLL) circuit, and providing real time tracking of the noise cancellation signal across different operating conditions to provide continuous suppression of the noise in the DPLL circuit.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to an adaptive noise cancellation circuit, and more particularly, to a circuit and a method for adaptive noise cancellation for fractional-N digital phase-locked loops (DPLL). In specific embodiments, the adaptive sigma delta quantization noise cancellation circuit for fractional-N digital phase-locked loops (DPLL) is a noise cancellation circuit which has a fast and low complexity adaptive structure. This structure is achieved by implementing an efficient approximation for a normalized least mean square (NLMS) algorithm, accurately suppressing noise generated by a feedback sigma-delta modulator, real-time tracking for continuous quantization noise cancellation across different operating conditions (e.g., temperature), and rejecting low frequency fractional spurs using fast tracking. Further, in the specific embodiments, by implementing the efficient approximation for the NLMS algorithm, accuracy of the algorithm can be improved.

Advantageously, by implementing the circuit disclosed herein, a low complexity circuit with a smaller area and lower power is achieved by enabling real-time tracking at a lower cost than known circuitry. Further, by implementing the circuit disclosed herein, the approximation of a normalized least mean squares (NLMS) results in fast tracking and a low steady-state error (i.e., negligible amount of adaptation noise).

Figure 1:
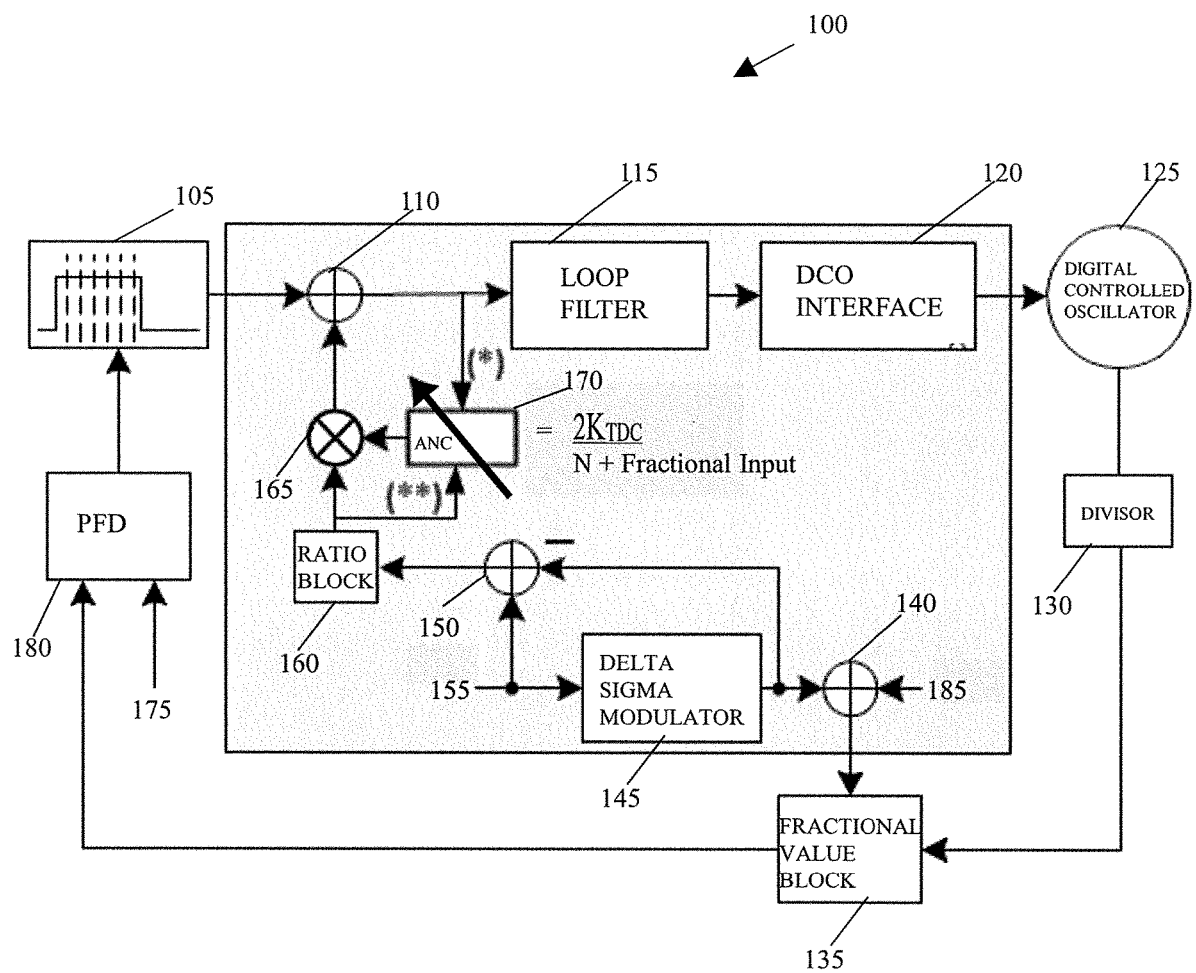
FIG. 1 shows an overview of a noise cancellation circuit in accordance with aspects of the present disclosure.

FIG. 1 shows an overview of a noise cancellation circuit in accordance with aspects of the present disclosure. In embodiments of the present disclosure, a noise cancellation circuit 100 includes a time to digital converter (TDC) circuit 105 which converts a pulse signal in a time domain to a digital representation and outputs a signal to an adder 110. The output of the adder 110 is input to a loop filter 115, which filters out frequencies and outputs a signal to a dithering thermos coding (DCO) interface 120. The DCO interface 120 injects a dither signal and outputs a signal to a digital control oscillator 125. The digital control oscillator 125 synchronizes with an external frequency and outputs a signal to a divisor 130. The divisor 130, which cannot handle fractions, outputs a signal to the fractional value block 135. The fractional value block 135 multiples the input by a ratio and outputs a signal to a phase frequency detector (PFD) 180. A delta sigma modulator 145 calculates a fractional value (with noise) and outputs a signal to adders 140, 150. The adder 140 outputs a signal back to the fractional value block 135, and the adder 150 outputs a signal to the ratio block 160. The ratio block 160 multiplies the input by a ratio and then outputs a signal to the multiplier 165 and the adaptive noise canceller 170. The adaptive noise canceller 170 outputs a noise cancelling signal, which will suppress the fractional value (with noise) generated from the delta sigma modulator 145. The adaptive noise canceller 170 outputs a signal to the multiplier 165. The output of the multiplier 165 is sent to the adder 110. In other words, the output of the multiplier 165 is used to cancel the noise generated by the delta sigma modulator 145 which is passed through the PFD 180 and the TDC circuit 105 at the adder 110.

In the operation, the time to digital converter (TDC) circuit 105 converts a time representation of a pulse (i.e., an error signal in a time domain) into a digital representation and output the digital representation of the error signal. The digital representation output from the TDC circuit 105 and an output signal from the multiplier 165 will be added at the adder 110 and output as a combined signal to the loop filter 115. The loop filter 115 receives the combined signal and filters out unwanted frequencies and outputs the filtered signal to the DCO interface 120. The DCO interface 120 injects a short dither signal to the filtered signal in order to overcome quantization noise and outputs a filtered dither signal. The digital control oscillator 125 receives the filtered dither signal and reduces frequency discontinuities and spurs through synchronization with an external frequency. In a non-limiting example, the digital control oscillator 125 can synchronize the filtered dither signal at approximately 20 gigahertz (GHz) and output an oscillated signal. The divisor 130 receives the oscillated signal, divides the oscillated signal, and outputs a divided signal to the fractional value block 135.

The fractional input 155 is input to the delta sigma modulator 145 and the adder 150. The delta sigma modulator 145 receives the fractional input 155, calculates a fractional value (with noise), and outputs the fractional value (with noise) to the adders 140, 150. The adder receives 140 the fractional value (with noise) and the N value 185 and outputs a combined fractional N value (with noise) to the fractional value block 135. The fractional value block 135 receives the combined fractional N value (with noise) and the divided signal, multiplies these inputs by a ratio of 1/N, and outputs a fractional value block output signal (with noise) to the PFD 180. The PFD will output an error signal (i.e., $E_k$ signal) in a time domain to the TDC circuit 105.

In embodiments, the adder 150 subtracts the fractional value (with noise) from the fractional input 155 and outputs a subtracted fractional value. The ratio block 160 receives the subtracted fractional value, multiples the subtracted fractional value by $(1/(1-z^{-1}))$, and outputs a ratio output signal to the multiplier 165 and the adaptive noise canceller 170. The adaptive noise canceller 170 can receive the ratio output signal and the output of the adder 110 (i.e., the combined signal) and converge these inputs to a ratio of $(2*K_{TDC})/(N+\text{Fractional Input})$. This ratio (i.e., $(2*K_{TDC})/(N+\text{Fractional Input})$) represents the ratio of the time to digital converter (TDC) gain to a channel number. The adaptive noise canceller 170 will cancel (i.e., suppress) the noise from the delta sigma modulator 145 as will be described in further detail with respect to FIGS. 4 and 5. The output of the adaptive noise canceller 170 is an error offset and is input to the multiplier 165.

The multiplier 165 receives the error offset from the adaptive noise canceller 170 and the ratio output signal from the ratio block 160 and outputs a noise cancellation signal to the adder 110. The PFD 180, which receives the fractional value block output signal (with noise) from the fractional value block 135, compares that signal to the reference signal 175 (which is at a predetermined frequency). In particular, the frequency of the fractional value block output signal (with noise) is compared to the frequency of the reference signal 175.

If the frequency of the fractional value block output signal (with noise) is equal to the frequency of the reference signal 175, then no error signal is output from the PFD 180. In contrast, if the frequency of the fractional value block output signal (with noise) is different from the frequency of the reference signal 175, the difference is output from the PFD 180 as the error signal (i.e., $E_k$ signal) in a time domain. The error signal (i.e., $E_k$ signal) in the time domain is then received at the TDC circuit 105 and the feedback loop is continued until the frequency of the fractional value block output signal (with noise) is equal to the frequency of the reference signal 175. If the frequency of the fractional value block output signal (with noise) is equal to the frequency of the reference signal 175, there is no error signal and the noise from the delta sigma modulator 145 is completely cancelled. Further, the error signal (i.e., $E_k$ signal) in the time domain output from the PFD 180 allows for real time tracking in the noise cancellation circuit 100.

Figure 2:
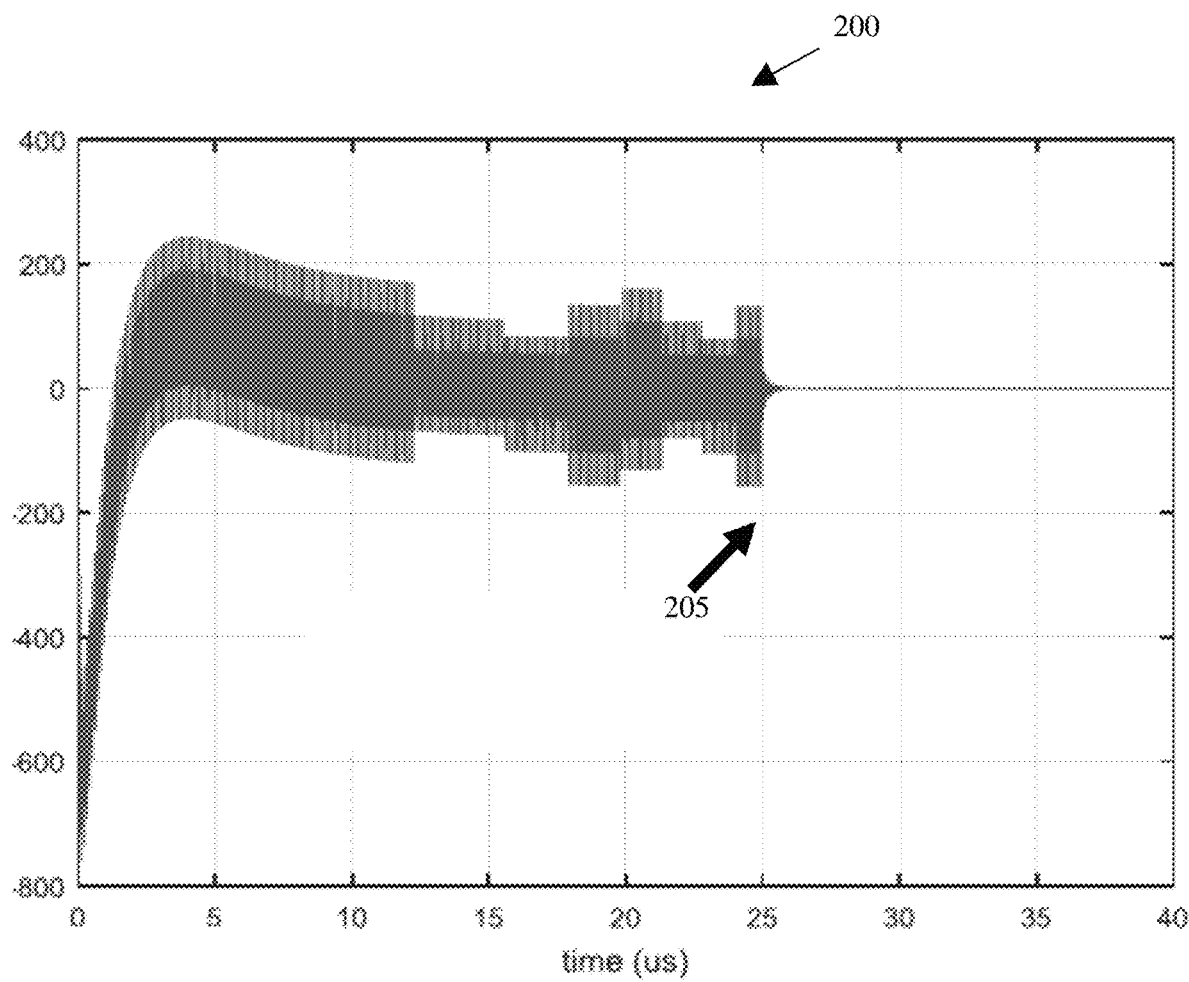
FIG. 2 shows a graph of the characteristics of a loop filter of the noise cancellation circuit shown in FIG. 1, in accordance with aspects of the present disclosure.

FIG. 2 shows a graph of the characteristics of the loop filter of the noise cancellation circuit shown in FIG. 1 in accordance with aspects of the present disclosure. More specifically, FIG. 2 shows the characteristics of the loop filter input 200. In FIG. 2, time is shown on the x-axis and the noise is shown on the y-axis. In FIG. 2, at point 205 (at approximately 25 microseconds), the noise cancellation circuit 100 is turned on and within 1 microsecond (i.e., 1 μsec), the noise from the delta sigma modulator 145 is tracked and canceled.

Figure 3:
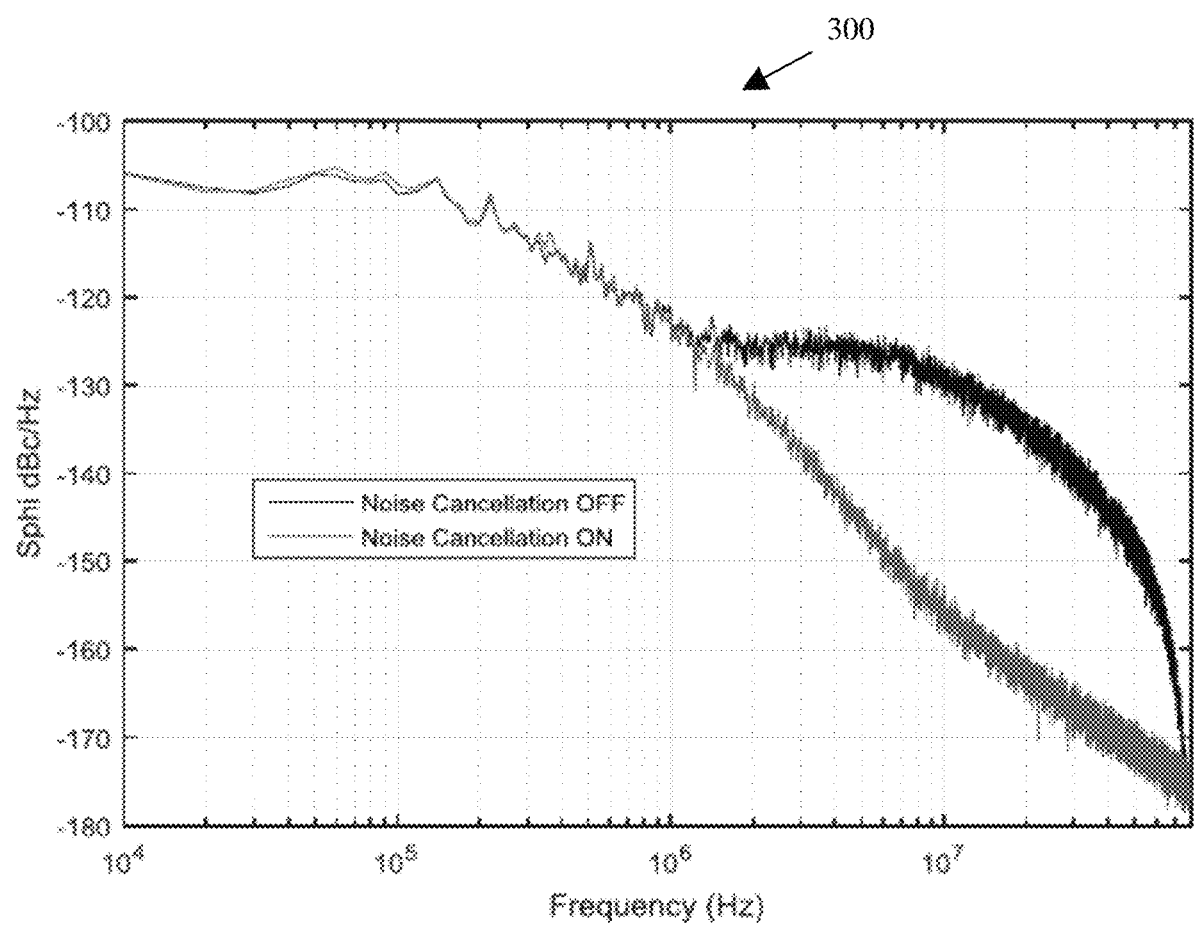
FIG. 3 shows a graph of the characteristics of a digital control oscillator phase power spectral density (PSD) of the noise cancellation circuit shown in FIG. 1, in accordance with additional aspects of the present disclosure.

FIG. 3 shows a graph of the characteristics of a digital control oscillator phase power spectral density (PSD) of the noise cancellation circuit shown in FIG. 1. More specifically, FIG. 3 shows the characteristics of the voltage controlled oscillator phase power spectral density (PSD) 300. In FIG. 3, frequency in Hz is shown on the x-axis and the noise in dBc/Hz is shown on the y axis. Further, as shown in FIG. 3, when using the circuit and methods of the noise cancellation circuit 100 in FIG. 1, the noise is dramatically reduced above the frequency of $10^6$ Hz.

FIGS. 2 and 3 show that real-time tracking of the TDC gain and normalization of the channel ratio can be accomplished through the noise cancellation circuit 100. Further, FIGS. 2 and 3 show that a low-complexity approximation of a normalized least mean squares (LMS) algorithm can be accomplished using the noise cancellation circuit 100. In addition, FIGS. 2 and 3 show that a fast adaptation speed and stable steady state performance can be accomplished using the noise cancellation circuit 100.

In known circuitry, a normalized least means square (LMS) algorithm can be fast, but also requires a high level of circuit complexity. For example, in the normalized LMS, an update equation is shown below:

$$g_k = g_{k-1} + \mu^*(x_k/|x_k|^2)^* e_k \quad \text{(Equation 1)}$$

In Equation 1, $g_k$ is an output gain at a kth interval, $x_k$ is an input signal, μ is a programmed fixed value, and $e_k$ is an error signal. Further, in equation 1, normalization by a square magnitude of the signal $x_k$ requires a real-time multiply and a divide operation. Therefore, it should be understood by those of ordinary skill in the art that signal normalization, three multipliers, and one divider is required in known circuitry implementing fractional-N frequency synthesizers. However, the divider is difficult to implement at a fast rate because the divider requires a high amount of power and a large amount of area. The embodiments of the present disclosure do not need a divider in the noise cancellation circuit.

Figure 4:
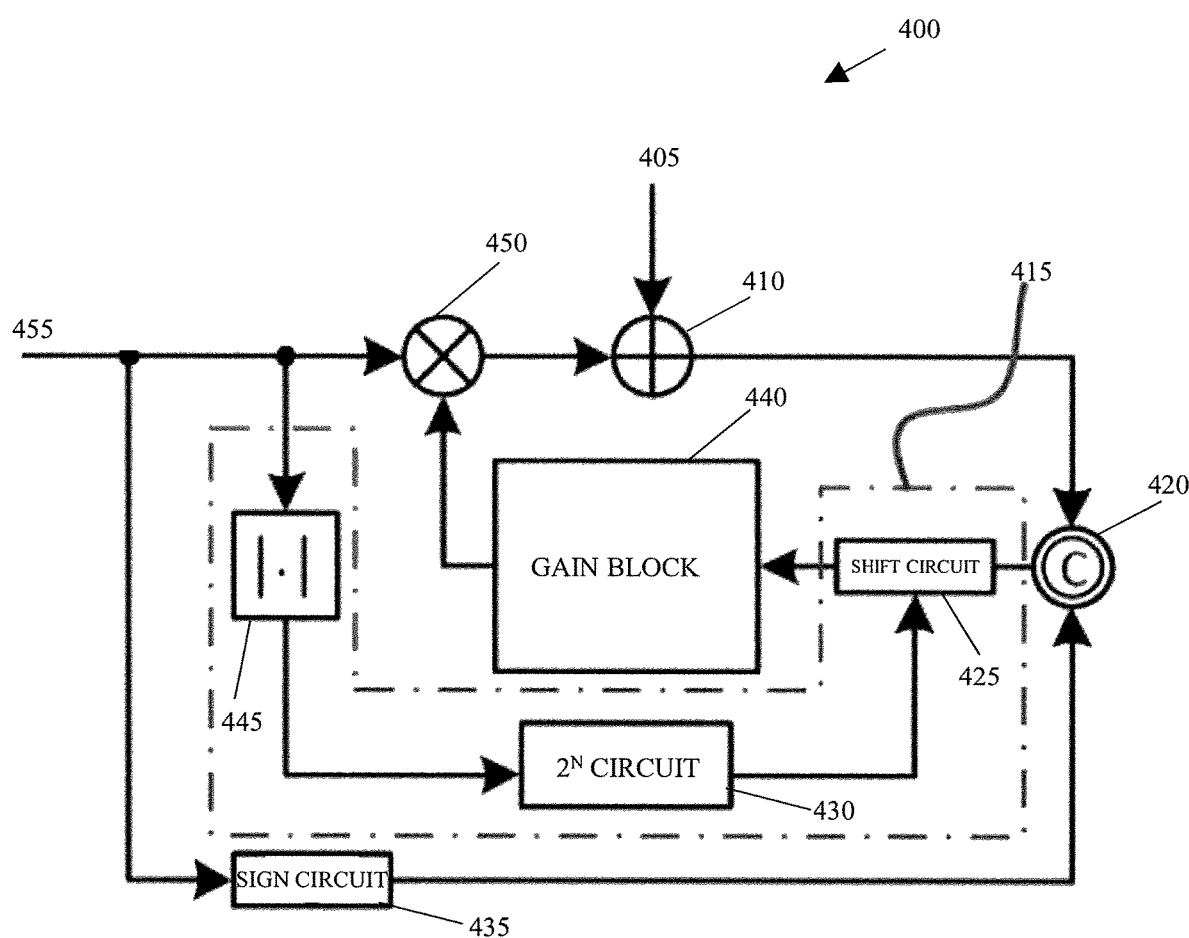
FIG. 4 shows an implementation of adaptive noise canceller of FIG. 1 in accordance with aspects of the present disclosure.

FIG. 4 shows an implementation of an adaptive noise canceller of the noise cancellation circuit shown in FIG. 1. In FIG. 4, Equation 1 can be rewritten as follows to approximate a normalized LMS:

$$g_k = g_{k-1} + \mu*(x_k/|x_k|)*(e_k/|x_k|) = g_{k-1} + \mu*\text{sign}(X)*(e_k/|x_k|) \quad \text{(Equation 2)}$$

Using Equation 2, $|x_k|$ can be approximated with the closest power of 2: $|x_k| \approx 2^n{}_k$. Therefore, Equation 2 can be rewritten as follows to approximate a normalized LMS:

$$g_k = g_{k-1} + \mu*2^n{}_k*\text{sign}(x)*e_k \quad \text{(Equation 3)}$$

In Equation 3, parameter $\mu$ can be chosen as a constant power of two. In equation 3, the power of 2 approximation of $|x_k|$ (i.e., $2^n{}_k$) operation can be performed using a simple priority encoder approximation circuit 415 in FIG. 4 (i.e., a straightforward combinational circuit). Lastly, in Equation 3, no multiply or divide operation is required, which simplifies the hardware implementation.

In embodiments of the present disclose, the implementation of the adaptive noise canceller 400 (i.e., similar to the adaptive noise canceller 170) using Equation 3 includes a TDC_Count y 405, adder 410, priority encoder approximation circuit 415, a combination circuit 420, a shift circuit 425, a $2^n$ circuit 430, a sign circuit 435, a gain block 440, an absolute value circuit 445, a multiplier 450, and a noise x 455. In specific embodiments, the priority encoder approximation circuit 415 includes the shift circuit 425, the $2^n$ circuit 430, and the absolute value circuit 445. The adaptive noise canceller 400 only requires one multiplier and no dividers. Further, the adaptive noise canceller 400 uses a combinatorial priority encoder for a power of two approximation. The two's complement in the adaptive noise canceller 400 is used for error sign inversion and the shift register. Thus, the approximation of the normalized LMS in the adaptive noise canceller 400 provides a simplified hardware implementation, smaller area, and lower power than the known circuitry. Further, the adaptive noise canceller 400 allows for real-time tracking at a low cost.

In operation, the adaptive noise canceller 400 receives the noise x 455 and the TDC_Count y 405. The adder 410 receives the TDC_Count y 405 and the output from the multiplier 450, adds these signals, and outputs the error signal (i.e., $e_k$) to the combination circuit 420. The sign circuit 435 receives the noise x 455, performs a sign operation, and outputs a signed output signal to the combination circuit 420. The combination circuit 420 receives the signed output signal and the error signal (i.e., $e_k$), combines these signals, and outputs a combined signal to the shift circuit 425.

Moreover, the absolute value circuit 445 receives the noise x 455, performs an absolute value operation, and outputs an absolute value of the noise x 455 as an absolute signal. The $2^n$ circuit 430 receives the absolute signal, performs a $2^n$ operation, and outputs a $2^n$ output signal. The shift circuit 425 receives the $2^n$ output signal and the combined signal, shifts the $2^n$ output signal and the combined signal, and outputs a combined shifted signal. The gain block 440 receives the combined shifted signal, multiplies the combined shifted signal by $(\mu*z^{-1}/(1-z^{-1}))$, and provides an output gain $g_k$ at a kth interval. The multiplier 450 receives the output gain $g_k$ at the kth interval and the noise x 455, multiples these signals together, and outputs a multiplied signal to the adder 410. The feedback loop then continues and repeats the operations described above.

Figure 5:
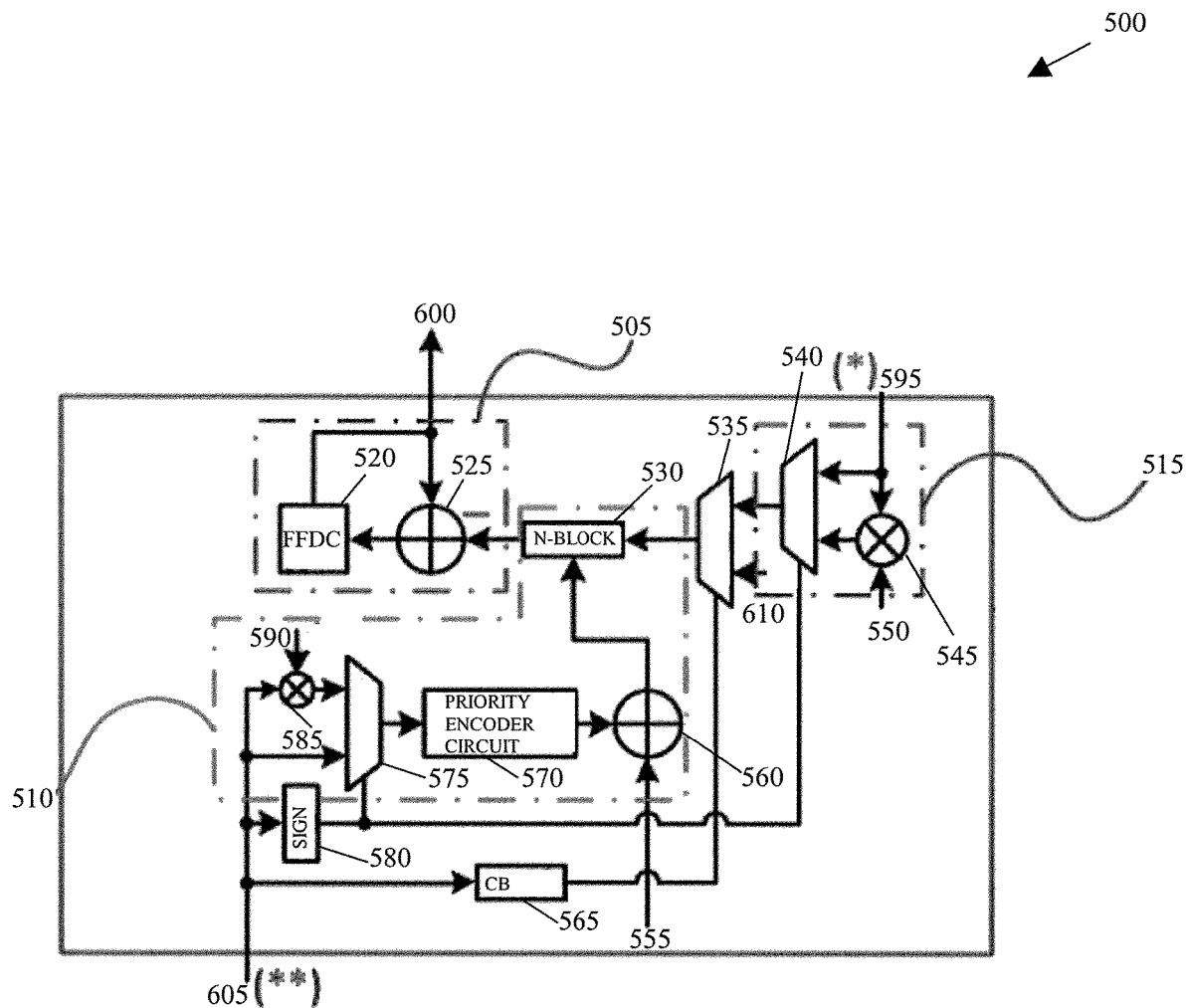
FIG. 5 shows a detailed implementation of an adaptive noise canceller of the noise cancellation circuit shown in FIG. 4 in accordance with aspects of the present disclosure.

FIG. 5 shows a detailed implementation of the adaptive noise canceller of FIG. 4. In embodiments, the adaptive noise canceller 500 (i.e., similar to the adaptive noise canceller 170) includes a ratio-z block 505, a priority encoder approximation block 510, a sign block 515, a flip flop delay circuit 520, adders 525, 560, an n-block 530, multiplexers 535, 540, 575, multipliers 545, 585, a negative one input 550, a $\mu$ input 555, a comparison block 565, a priority encoder circuit 570, a sign 580, a positive one input 590, an error signal $e_k$ 595, a gain signal $g_k$ 600, an input signal $x_k$ 605, and a zero input 610. In embodiments, the ratio-z block 505 includes the flip flop delay circuit 520 and the adder 525. The sign block 515 includes the multiplexer 545 and the multiplier 550 and performs a two's complement operation. The priority encoder approximation block 510 includes the n-block 530, the adder 560, the priority encoder circuit 570, the multiplexer 575, and the multiplier 585.

In FIG. 5, the multiplier 550 receives an error signal $e_k$ and outputs a signal to the multiplexer 540. The multiplexer 540 selects a signal and outputs the signal to the multiplexer 535. The multiplexer 535 selects a signal and outputs the signal to the n-block 530. The n-block 530 performs a shift operation and outputs a signal to the adder 525. The adder 525 outputs a signal to the flip flop delay circuit 520. The flip flop delay circuit 520 outputs a signal to the input of the adder 525. The gain signal $g_k$ is input to the multiplier 585, the multiplexer 575, the sign 580, and the comparison block 565. The sign 580 performs a sign operation and outputs a signal to the multiplexers 540, 575. The comparison block 565 compares the input signal and outputs a signal to the multiplexer 535. The multiplier 585 outputs a signal to the multiplexer 575. The multiplexer 575 selects a signal and outputs the signal to the priority encoder circuit 570. The priority encoder circuit 570 performs an approximation magnitude of $|x_k|$ with the power of 2 and outputs a signal to the adder 560. The adder 560 outputs a signal to the n-block 530.

In operation, the error signal $e_k$ 595 is input to the multiplier 550 and the multiplexer 540. The negative one input 550 (i.e., −1 input) is also input to the multiplier 550. The multiplier 550 receives the negative one input 550 and the error signal $e_k$ 595, multiplies them together, and outputs a multiplied signal to the multiplexer 540. The multiplexer 540 will output either the multiplied signal or the error signal $e_k$ 595 as a first multiplexer output based on a value of the output from the sign 580 (which is used as the selection signal for the multiplexer 540). The multiplexer 535 receives the multiplexer output from the multiplexer 540 and the zero input 610 (i.e., 0 input) and outputs a second multiplexer output based on a value of the output from the comparison block 565 (which is used as the selection signal for the multiplexer 535). The second multiplexer output is sent to the n-block 530. The n-block 530 also receives an output from the adder 560. The n-block 530 will perform a shift operation (i.e., $2^n$) based on the output from the adder 560 and the second multiplexer output and sends the n-block output to the adder 525. The adder 525 receives the n-block output and the gain signal $g_k$ 600, adds the n-block output and the gain signal $g_k$ 600, and outputs an added signal to the flip flop delay circuit 520. The flip flop delay circuit 520 delays the added signal and outputs the delayed added signal to the gain signal $g_k$ 600.

In further operation, the comparison block 565 receives the input signal $x_k$ 605. The comparison block 565 will determine whether there is any error in the input signal $x_k$ 605 (i.e., if the error=0) based on a frequency of the input signal $x_k$ 605 and set a value of the output of the comparison block 565 based on the determination. As stated above, the output from the comparison block 565 is used as a selection signal for the multiplexer 535. The multiplier 585 receives the input signal $x_k$ 605 and the positive one input 590 (i.e., +1 input), multiplies these inputs together, and outputs another multiplied output signal to the multiplexer 575.

The sign 580 receives the input signal $x_k$ 605, performs a sign function on the input signal $x_k$ 605, and outputs a signal based on the sign function to the multiplexers 540, 575. The multiplexer 575 receives the multiplied output signal from the multiplier 585 and the input signal $x_k$ 605 and outputs a third multiplexer output based on a value of the output from the sign 580 (which is used as the selection signal for the multiplexer 575).

The priority encoder circuit 570 receives the third multiplexer output, performs an approximation magnitude of $|x_k|$ with the power of 2, and outputs a priority encoder output signal. The adder 560 will receive the priority encoder output signal from the priority encoder circuit 570 and the p input 555, perform an addition of the priority encoder output signal and the p input 555, and output an additive signal to the n-block 530. The feedback loop will then continue performing the operations described above. In embodiments, the detailed implementation of the adaptive noise canceller 500 has a small area, low power, and can perform real-time tracking.

In FIG. 5, the adaptive noise canceller 500 (similar to the adaptive noise canceller 170) will cancel (i.e., suppress) the noise from the delta sigma modulator 145. In particular, the adaptive noise canceller 500 will result in fast tracking and low steady-state error (i.e., negligible amount of adaptation noise).

The circuit and the method for adaptive noise cancellation for fractional-N digital phase-locked loops (DPLL) of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and the method for adaptive noise cancellation for fractional-N digital phase-locked loops (DPLL) of the present disclosure has been adopted from integrated circuit (IC) technology. For example, the structures are built on wafers and are realized in films of material patterned by photolithographic processes on the top of a wafer. In particular, the fabrication of the circuit and the method for adaptive noise cancellation for fractional-N digital phase-locked loops (DPLL) uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Further, the circuit and the method for logic-in-memory computations of the present disclosure can have wide applicability in high throughput processors for machine learning and artificial intelligence.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising an adaptive noise canceller circuit which is configured to suppress noise by a feedback delta-sigma modulator circuit and provide real-time tracking of a noise cancellation signal,
wherein the adaptive noise canceller circuit comprises a priority encoder approximation circuit which is configured to perform a power of 2 operation, and
the priority encoder approximation circuit comprises a shift circuit, a $2^n$ circuit, and an absolute value circuit.

2. The structure of claim 1, wherein the absolute value circuit receives the noise, performs an absolute value operation, and outputs an absolute signal to the $2^n$ circuit.

3. The structure of claim 2, wherein the $2^n$ circuit receives the absolute signal, performs a $2^n$ operation, and outputs a $2^n$ signal to the shift circuit.

4. The structure of claim 3, wherein the shift circuit receives the $2^n$ signal, shifts the $2^n$ signal, and outputs a combined shifted signal.

5. The structure of claim 4, further comprising a gain block which receives the combined shifted signal, multiplies the combined shifted signal by a predetermined ratio, and outputs an output gain.

6. The structure of claim 5, wherein the output gain is used to generate the noise cancellation signal to suppress the noise by the feedback sigma-delta modulator circuit.

7. The structure of claim 1, wherein the adaptive noise canceller circuit and the feedback sigma-delta modulator circuit is included in a digital phase locked loop (DPLL).

8. The structure of claim 1, wherein the feedback sigma-delta modulator circuit generates the noise during calculation of a fractional value.

9. A circuit comprising:
a feedback delta-sigma modulator circuit which is configured to calculate a fractional value that includes noise in a digital phase locked loop (DPLL) circuit during calculation; and
an adaptive noise canceller circuit which comprises a priority encoder approximation circuit and is configured to generate a noise cancellation signal to suppress the noise in the DPLL circuit,
wherein the priority encoder approximation circuit is configured to perform a power of 2 operation, and
the priority encoder approximation circuit comprises a shift circuit, a $2^n$ circuit, and an absolute value circuit.

10. The structure of claim 9, wherein the absolute value circuit receives the noise, performs an absolute value operation, and outputs an absolute signal to the $2^n$ circuit.

11. The structure of claim 10, wherein the $2^n$ circuit receives the absolute signal, performs a $2^n$ operation, and outputs a $2^n$ signal to the shift circuit.

12. The structure of claim 11, wherein the shift circuit receives the $2^n$ signal, shifts the $2^n$ signal, and outputs a combined shifted signal.

13. The structure of claim 12, further comprising a gain block which receives the combined shifted signal, multiplies the combined shifted signal by a predetermined ratio, and outputs an output gain.

14. The structure of claim 13, wherein the output gain is used to generate the noise cancellation signal to suppress the noise by the feedback sigma-delta modulator circuit.

15. A method, comprising:
   generating a noise cancellation signal to suppress noise in a digital phase locked loop (DPLL) circuit; and
   providing real time tracking of the noise cancellation signal across different operating conditions to provide continuous suppression of the noise in the DPLL circuit,
   wherein the generating the noise cancellation signal to suppress the noise in the DPLL circuit further comprises:
   receiving the noise;
   performing an absolute value operation on the noise to generate an absolute value signal;
   performing a $2^n$ operation on an absolute value signal to generate a $2^n$ signal;
   shifting the $2^n$ signal to generate a combined shifted signal;
   multiplying the combined shifted signal by a predetermined ratio to generate an output gain; and
   generating the noise cancellation signal using the output gain.

* * * * *